United States Patent
Ehara

(10) Patent No.: US 12,034,102 B2
(45) Date of Patent: Jul. 9, 2024

(54) LED LIGHT SOURCE AND METHOD OF MANUFACTURING THE SAME

(71) Applicant: NICHIA CORPORATION, Anan (JP)

(72) Inventor: Munetsugu Ehara, Anan (JP)

(73) Assignee: NICHIA CORPORATION, Anan (JP)

( * ) Notice: Subject to any disclaimer, the term of this patent is extended or adjusted under 35 U.S.C. 154(b) by 317 days.

(21) Appl. No.: 17/371,055

(22) Filed: Jul. 8, 2021

(65) Prior Publication Data

US 2022/0077360 A1    Mar. 10, 2022

(30) Foreign Application Priority Data

Sep. 10, 2020   (JP) .................................. 2020-151980

(51) Int. Cl.
| | | |
|---|---|---|
| *H01L 33/58* | (2010.01) | |
| *G02B 6/42* | (2006.01) | |
| *H01L 33/48* | (2010.01) | |
| *H01L 33/62* | (2010.01) | |
| *G02F 1/13357* | (2006.01) | |

(52) U.S. Cl.
CPC .............. *H01L 33/58* (2013.01); *G02B 6/423* (2013.01); *G02B 6/4239* (2013.01); *H01L 33/486* (2013.01); *H01L 33/62* (2013.01); *G02F 1/1336* (2013.01); *H01L 2225/1076* (2013.01); *H01L 2933/0058* (2013.01); *H01L 2933/0066* (2013.01)

(58) Field of Classification Search
CPC .... G02B 6/423; G02B 3/0075; G02B 6/4239; H01L 33/486; H01L 2225/1076; H01L 33/58; H01L 33/62; H01L 2933/0058
See application file for complete search history.

(56) References Cited

U.S. PATENT DOCUMENTS

| | | | | |
|---|---|---|---|---|
| 5,883,425 | A | | 3/1999 | Kobayashi |
| 6,025,998 | A | * | 2/2000 | Kitade ................. H05K 3/3405 |
| | | | | 257/659 |
| 2011/0141862 | A1 | * | 6/2011 | Arai ...................... G11B 5/4866 |
| 2014/0160767 | A1 | * | 6/2014 | Chen ....................... F21V 5/002 |
| | | | | 362/335 |
| 2016/0336716 | A1 | * | 11/2016 | Adachi ................. H01L 33/486 |

(Continued)

FOREIGN PATENT DOCUMENTS

| | | |
|---|---|---|
| JP | 01-135773 U | 9/1989 |
| JP | 08-037397 | 2/1996 |
| JP | 09-121040 | 5/1997 |

(Continued)

*Primary Examiner* — Feifei Yeung Lopez
(74) *Attorney, Agent, or Firm* — MORI & WARD, LLP

(57) ABSTRACT

An LED light source includes a board, a holder, an LED, a fastener, a lens, a supporter, and an adhesive. The board has a first surface. The holder is arranged on or above the first surface. The LED is arranged on or above the first surface. The fastener fastens the LED to the first surface. The lens has an exterior shape larger than the LED as viewed in a plan view, and is arranged on or above an LED upper surface to refract LED light so as to direct the light outward. The supporter is arranged on an exterior with respect to the LED as viewed in a plan view on a lens surface facing the first surface. The supporter is held by the holder for positioning of the lens at a predetermined position on the first surface. The adhesive bonds the supporter and the board together.

20 Claims, 11 Drawing Sheets

(56) References Cited

U.S. PATENT DOCUMENTS

2019/0063695 A1\* 2/2019 Oh .......................... F21V 9/32

FOREIGN PATENT DOCUMENTS

| | | |
|---|---|---|
| JP | 09-130009 | 5/1997 |
| JP | 2002-198632 | 7/2002 |
| JP | 2002-325193 | 11/2002 |
| JP | 2005-203511 | 7/2005 |
| JP | 2006-080227 | 3/2006 |
| JP | 2010-073801 | 4/2010 |
| JP | 2011-086569 | 4/2011 |
| JP | 2011-128290 | 6/2011 |
| JP | 2013-118055 | 6/2013 |
| JP | 2016-213412 | 12/2016 |

\* cited by examiner

LED LIGHT SOURCE AND METHOD OF MANUFACTURING THE SAME

CROSS-REFERENCE TO RELATED APPLICATIONS

The present application claims priority under 35 U.S.C. § 119 to Japanese Patent Application No. 2020-151980, filed on Sep. 10, 2020, the content of which is incorporated herein by reference in their entirety.

BACKGROUND

The present disclosure relates to an LED light source and a method of manufacturing an LED light source capable of facilitating easy positioning of a light-transmissive part with respect to an LED fastened onto a print board surface.

Some LED light sources include a light-transmissive part (e.g., optical lens) that refracts LED light to direct the light outward. These LED light sources use such an optical lens to diffuse or collect LED light, and are used in various applications. For example, LED light sources to be used for a liquid crystal display backlight include an optical lens that diffuses LED light to reduce light unevenness, in other words, to prevent a partial bright part from being noticeable. An LED light source for a backlight includes a plurality of LEDs that are fastened onto a surface of a printed board, and an optical lens that diffuses light emitted by the LEDs to reduce light unevenness whereby providing even light distribution over the entire light emission surface. In the LED light sources that include an optical lens refracting light incident from an LED to direct the light outward, it is important for the optical lens to correctly diffuse or collect the LED light so as to provide an accurately correct light distribution pattern. To provide such an accurately correct light distribution pattern, it is the key to accurately agree an optical axis of the LED with an optical axis of the optical lens. It is because the optical lens is designed to provide a desired light distribution pattern when the optical axis of the optical lens agrees with the optical axis of the LED.

To fasten chips (e.g., IC, capacitor, etc.) onto a surface of a printed board, and arrange a frame covering the chips at a predetermined position, a structure which includes a printed board having protrusions on its surface and a frame to be arranged at a predetermined position on the interior side with respect to the protrusions has been developed (See Japanese Patent Laid-Open Publication No. JP H09-130,009 A).

Another developed structure includes a printed board which has a number of protrusions, and a component which is to be mounted onto the printed board and has positioning recessed parts to be fitted to the protrusions so as to position the component at a predetermined position on the printed board (See Japanese Patent Laid-Open Publication No. JP 2002-198,632 A).

There is a need to provide an LED light source and a method of manufacturing an LED light source which can facilitate easy positioning of a light-transmissive part with respect to an LED fastened onto a printed-board surface.

SUMMARY

An LED light source according to one aspect of the present disclosure includes a board, two or more holders, an LED, a fastener, a light-transmissive part, a supporter, and an adhesive. The board has a first surface. The holders are arranged on or above the first surface. The LED is arranged on or above the first surface. The fastener fastens the LED to the first surface. The light-transmissive part has an exterior shape larger than the LED as viewed in a plan view, and is arranged on or above an upper surface of the LED to refract light emitted by the LED so as to direct the light outward. The supporter is arranged on an exterior with respect to the LED as viewed in the plan view on a surface of the light-transmissive part that faces the first surface of the board. The adhesive bonds the supporter and the board together. Each of the holders includes a protrusion that is formed on the first surface of the board. The holders, which hold the supporter, as the protrusions are arranged at vertices of a polygon, and the supporter is arranged in an area defined by the polygon. The supporter is held by the holders whereby positioning the light-transmissive part at a predetermined position on the first surface of the board.

An LED light source according to another aspect of the present disclosure includes a board, a holder, an LED, a fastener, a light-transmissive part, a supporter, and an adhesive. The board has a first surface. The holder that is arranged on or above the first surface. The LED is arranged on or above the first surface. The fastener fastens the LED to the first surface. The light-transmissive part has an exterior shape larger than the LED as viewed in a plan view, and is arranged on or above an upper surface of the LED to refract light emitted by the LED so as to direct the light outward. The supporter is arranged on an exterior with respect to the LED as viewed in the plan view on a surface of the light-transmissive part facing the first surface of the board. The supporter is held by the holder for positioning of the light-transmissive part at a position corresponding to an optical lens on the first surface of the board. The adhesive that bonds the supporter and the board together. The supporter has a receptacle recessed part in an end surface of the supporter. The holder includes a holding protrusion part that guides the receptacle recessed part so that the supporter is held by the holder by guiding the receptacle recessed part by the holding protrusion part.

A method of manufacturing an LED light source according to another aspect of the present disclosure includes preparation, fastening, formation, and arrangement. In the preparation, an LED, a board, a light-transmissive part, a fastener material, and an adhesive are prepared. The board has a first surface. The light-transmissive part has an exterior shape larger than the LED as viewed in a plan view. The light-transmissive part refracts light emitted by the LED so as to direct the light outward. Also, the light-transmissive part includes a supporter that is arranged on an exterior with respect to the LED as viewed in the plan view on a surface of the light-transmissive part facing the first surface. The fastener material forms a fastener to fasten the LED to the board. In the fastening, the fastener material is placed between the LED and the first surface so that the LED is fastened onto the first surface. In the formation, a holder is formed on or above the first surface from the fastener material. In the arrangement, the light-transmissive part is arranged at a predetermined position on the first surface, and the supporter and the board are bonded together by using the adhesive.

Thus, an LED light source and a method of manufacturing an LED light source capable of facilitating easy positioning of a light-transmissive part with respect to an LED fastened onto a print board surface can be provided.

A method of manufacturing an LED light source according to the foregoing aspect of the present disclosure can simplify manufacturing processes by forming a fastener that fastens an LED and a holder that holds a light-transmissive part at a predetermined position at one time.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION

Figure 1:
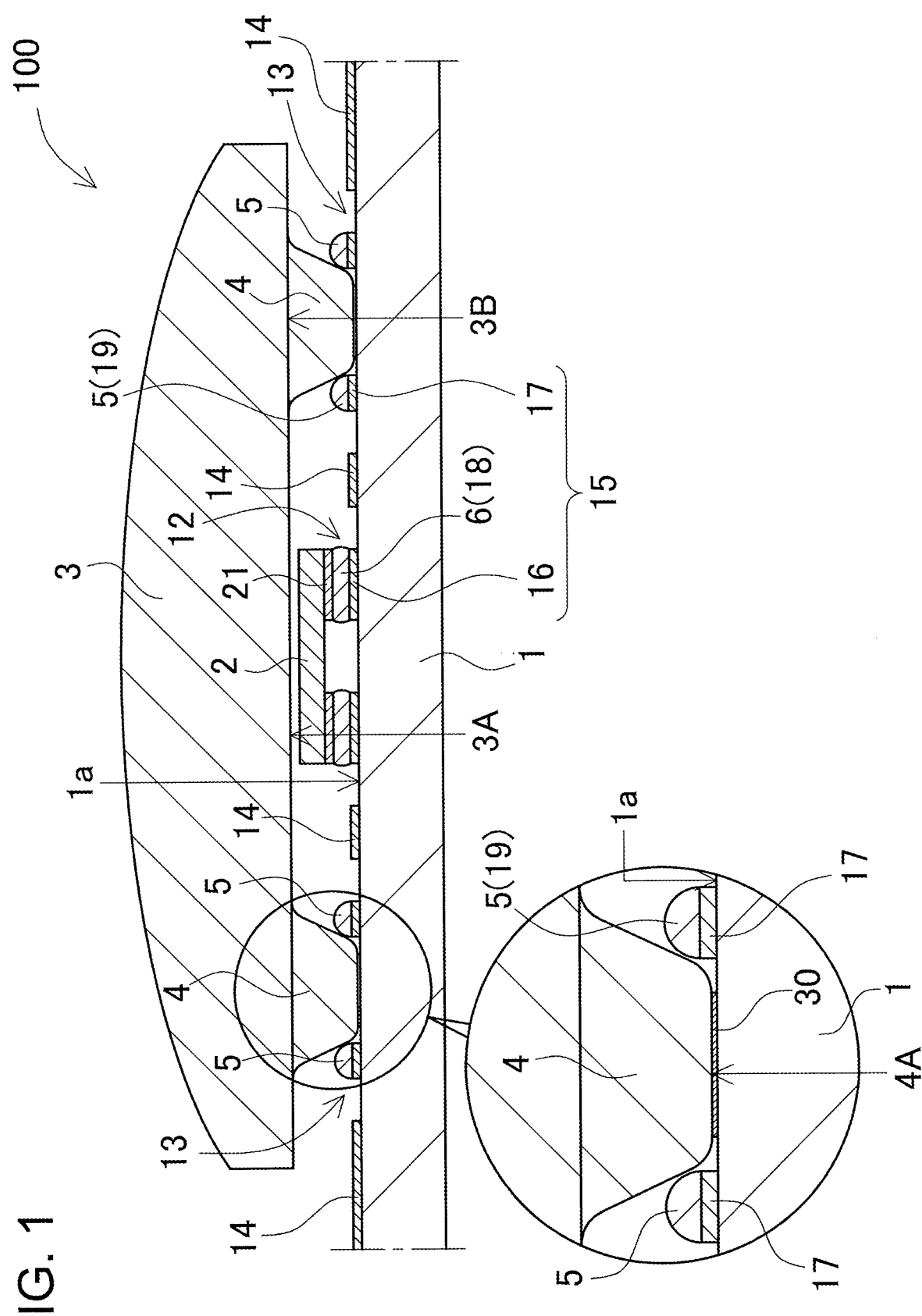
FIG. 1 is a cross-sectional view schematically showing an LED light source according to a certain embodiment of the present disclosure.

Embodiments of the present disclosure can have the following additional features.

In an LED light source according to an embodiment of the present disclosure, in the LED light source according to the aspect of the present disclosure stated in SUMMARY, it is preferable that the supporter is one of a plurality of supporters that are arranged on an exterior with respect to the LED as viewed in a plan view at different positions on a surface of the light-transmissive part facing the first surface of the board, and the holder is one of a number of holders that are arranged on the first surface, and that each supporter is held by two or more of the number of holders (a set of two or more of the holders) for positioning of the light-transmissive part at a predetermined position on the first surface of the board.

In an LED light source according to an embodiment of the present disclosure, it is preferable that the polygon has not smaller than three to not greater than six vertices.

In an LED light source according to an embodiment of the present disclosure, it is preferable that each protrusion has an inclined surface that declines toward the supporter as viewed in a cross-sectional side view to guide the supporter.

In an LED light source according to an embodiment of the present disclosure, it is preferable that each protrusion has a semicircular or semielliptical shape as viewed in a cross-sectional side view.

In an LED light source according to an embodiment of the present disclosure, it is preferable that the board is a printed board, and that the holder is formed of a material identical to a material of the fastener. According to this embodiment, a fastener, which fastens an LED to a board, and a holder, which serves to position a light-transmissive part at a predetermined position, can be simultaneously formed. As a result, manufacturing processes can be simple.

In an LED light source according to an embodiment of the present disclosure, it is preferable that the fastener and the holder are formed of solder, and that the board includes an electrode-connection electrically conducting layer part and a holder-placement electrically conducting layer part. The fastener is arranged on or above the electrode-connection electrically conducting layer part on the first surface side. The holder is arranged on or above the holder-placement electrically conducting layer part on the first surface side. According to this embodiment, solder enhances self-alignment effects which align an LED with a copper film pattern in arrangement of the LED when the solder melts. Thus, the LED can be easily positioned. In addition, because a holder formed of solder can be easily formed at a predetermined position by a holder-placement electrically conducting layer part, positioning of both an LED and a light-transmissive part can be facilitated.

In an LED light source according to an embodiment of the present disclosure, it is also preferable that the supporter has a pillar shape.

In an LED light source according to an embodiment of the present disclosure, it is also preferable that the supporter is tapered.

In an LED light source according to an embodiment of the present disclosure, it is also preferable that the supporter has a receptacle recessed part in an end surface of the supporter, and that the holder includes a holding protrusion part that guides the receptacle recessed part so that the supporter is held in the holder by guiding the receptacle recessed part by the holding protrusion part.

In an LED light source according to an embodiment of the present disclosure, it is preferable that the LED light source is used as a light source for a liquid crystal display backlight.

In an LED light source according to an embodiment of the present disclosure, it is preferable that the light-transmissive part is as an optical lens.

In a method of manufacturing an LED light source according to an embodiment of the present disclosure, in the method of manufacturing an LED light source according to the aspect of the present disclosure stated in SUMMARY, it is preferable that the holder and the fastener are formed from a same fastener material in the forming a holder on or above the first surface from the fastener material. According to this embodiment, a fastener, which fastens an LED to a board, and a holder, which serves to position a light-transmissive part at a predetermined position, can be simultaneously formed. As a result, manufacturing processes can be simple.

In a method of manufacturing an LED light source according to an embodiment of the present disclosure, the method further preferably includes forming an electrode-connection electrically conducting layer part and a holder-placement electrically conducting layer part. The fastener is arranged on or above the electrode-connection electrically conducting layer part on the first surface side. The holder is arranged on or above the holder-placement electrically conducting layer part on the first surface side. According to this embodiment, solder enhances self-alignment effects which align an LED with a copper film pattern in arrangement of the LED when the solder melts. Thus, the LED can be easily positioned. In addition, because a holder formed of solder can be easily formed at a predetermined position by the holder-placement electrically conducting layer part, positioning of both an LED and a light-transmissive part can be facilitated.

In a method of manufacturing an LED light source according to an embodiment of the present disclosure, it is preferable that a number of protrusions are formed as the holder at positions to enclose the supporter in the forming a holder on or above the first surface from the fastener material. Each protrusion has a convex upper surface. According to this embodiment, when a supporter of an optical part (light-transmissive part) is held by a holder, the supporter is surrounded by a number of protrusions each of which has a convex upper surface. As a result, the supporter can be easily guided into an area surrounded by the protrusions along their curved surfaces. Thus, positioning of the light-transmissive part at a predetermined position can be facilitated.

The following description will describe embodiments according to the present disclosure in detail with reference to the drawings. In the following description, although terms for indicating particular directions or positions (e.g., "upper" and "lower", and other terms including these terms) will be used as necessary for ease of understanding the present with reference to the drawings, the technical scope of the present disclosure is not limited by these terms. Portions attached with the same reference sign in different drawings show the portions or members same as or similar to each other.

It should be appreciated, however, that the embodiments described below are illustrations of an LED light source and a method of manufacturing an LED light source to give a concrete form to technical ideas of the invention, and an LED light source and a method of manufacturing an LED light source of the invention are not specifically limited to description below. Unless otherwise specified, any dimensions, materials, shapes and relative arrangements of the parts described below are given as an example and not as a limitation. In addition, the description for one embodiment may be applied to other embodiments or examples. Additionally, the sizes and the arrangement relationships of the members in the drawings are occasionally exaggerated for ease of explanation.

First Embodiment

LED light sources which include a light-transmissive part that refracts LED light to direct the light outward so as to control a distribution pattern of the light directed outside are used in various applications. For example, LED light sources to be used for a liquid crystal display backlight include a light-transmissive part that diffuses light emitted by an LED to provide even light distribution, in other words, to reduce light unevenness. LED light sources to be used for a car headlight include a light-transmissive part that collects LED light so as to provide a focused light distribution pattern, which brightly illuminates the road ahead. Such a light-transmissive part of an LED light source is arranged on a light emission side of an LED(s) to provide a desired light distribution pattern suitable for its application. The light-transmissive part is designed to provide the desired light distribution pattern when light emitted by the LED enters the light-transmissive part along an optical axis of the light-transmissive part. For this reason, if the light-transmissive part is positioned different from a desired position with respect to the LED, the desired light distribution pattern cannot be provided.

An LED light source 100 according to a first embodiment is now described with reference to a schematic cross-sectional view of FIG. 1 and an exploded perspective view of FIG. 2. The illustrated LED light sources 100 includes a printed board 1, an LED 2, which is fastened onto a first surface 1a of the printed board 1, and a light-transmissive part 3, which refracts light emitted by the LED 2 to direct the light outward. The printed board 1 has the first surface 1a. The first surface 1a corresponds to an upper surface of the printed board 1 shown in FIGS. 1 and 2. The LED 2 is arranged on or above the first surface 1a. Also, fasteners 6, which fasten the LED 2, are arranged on or above the first surface 1a. Also, a number of holders 5 are arranged on or above the first surface 1a (each holder 5 has plural protrusions, and in FIG. 2, three sets of three protrusion 5 thus total nine protrusion are formed). The light-transmissive part 3 is arranged on or above the upper surface of the LED 2, and has an exterior shape larger than the LED 2 as viewed in a plan view. Also, a plurality of supporters 4 are arranged on an exterior (i.e., an exterior side) with respect to the LED 2 as viewed in a plan view on a surface 3A of the light-transmissive part 3 facing the first surface 1a of the printed board 1. An adhesive 30 bonds the supporters 4 and the printed board 1 together. The light-transmissive part 3 of the LED light source 100 is positioned at a predetermined position on the first surface 1a of the printed board 1 by the holders 5 holding the supporters 4.

The supporters 4 preferably have a pillar shape. Also, the supporters 4 are preferably tapered. The supporters of an optical part (light-transmissive part) that have a pillar shape and/or tapered can be easily guided into an area surrounded by protrusions, which serve as the holders. The supporters are arranged at different positions on the surface 3A of the light-transmissive part 3, which faces the first surface 1a of the printed board 1. More specifically, each supporter 4 is held by its corresponding set of holders 5, in other words, by two or more (three in FIG. 2) of the number of holders 5.

Each holder 5 is constructed of the protrusion formed on the first surface 1a of the printed board 1. The two or more of the number of protrusions as the holders, which hold corresponding one of the plurality of supporters 4, are arranged at vertices of a polygon. Each supporter 4 is arranged in an area defined by the polygon. The polygon preferably has not smaller than three to not greater than six vertices. In other words, it is preferable that the polygon is a triangle, square, pentagon, or hexagon. In the case in which the two or more of the number of protrusions are arranged at vertices of a polygon, a displacement of the light-transmissive part can be prevented when the supporters of the light-transmissive part are held by the holders. Three supporters 4 are arranged at vertices of a single supporter triangle centering the LED 2 in the embodiment shown in FIG. 2.

Also, each protrusion preferably has a convex upper surface. According to this protrusion, when each supporter of the light-transmissive part is held by the two or more of the number of holders, the supporter is surrounded by the two or more of the number of protrusions as the holders each of which has a convex upper surface. As a result, the supporter can be easily guided into an area surrounded by the two or more of the number of protrusions along their curved surfaces. Thus, positioning of the light-transmissive part at a predetermined position can be facilitated. Each protrusion has an inclined surface in an area that includes corresponding one of the vertices of the polygon to guide the supporter 4. The inclined surface declines toward the supporter 4 as viewed in a cross-sectional side view. Also, each protrusion preferably has a semicircular or semielliptical shape as viewed in a cross-sectional side view. Thus, the supporters can be easily guided into an area surrounded by protrusions, which serve as the holders. The following description will describe the LED light source in more detail.

The printed board 1 has electrically conducting layer 15 parts, which are isolated from each other on the first surface 1a. The LED 2 includes electrodes, which are fastened onto some (e.g., two) of the electrically conducting layer 15 parts. The printed board 1 bonds the light-transmissive part 3, which refracts light emitted by the LED 2 to provide a desired light distribution pattern. More specifically, the LED 2 is fastened onto the printed board 1 by using the fasteners 6. The fasteners 6 can be formed of an electrically conductive material, such as solder. In the LED light source 100, the LED 2 is fastened onto the printed board 1 by using solder, and the light-transmissive part 3 is fastened onto the printed board 1 by using the adhesive 30.

The light-transmissive part 3 includes the plurality of supporters 4 arranged on a non-facing area 3B, which is located on the exterior side with respect to the LED 2 so as not to face the LED 2, in the board-facing surface 3A. Each supporter 4 is held by a holding structure constructed of the two or more of the number of holders 5, which are arranged on the first surface 1a of the printed board 1, and is bonded onto the printed board 1. The printed board 1 includes bonding solder parts 18 and holding solder parts 19. The LED 2 is positioned at a predetermined LED position by its self-alignment function in cooperation with the bonding solder parts 18 when soldered. Each holding solder part 19 forms corresponding one of the number of holders 5, which positions corresponding one of the supporters 4. In this specification, solder parts that serve as the fastener 6 to fasten the LED 2 are referred to as the bonding solder parts 18 in order to make a distinction between the bonding solder parts 18 and the holding solder parts 19, which form the holders 5. Each supporter 4 engages the holding structure, which is constructed of its corresponding holding solder parts 19 as a set of holders 5 so that the light-transmissive part 3 is positioned at the predetermined position on the first surface 1a of the printed board 1. The LED 2 is positioned at the desired LED predetermined position by its self-alignment function using surface tension of melted solder that will be the bonding solder parts 18 as the fasteners 6, and is fastened onto the printed board 1 by soldering.

The light-transmissive part 3 includes the plurality of supporters 4. Each supporter 4 engages the holding structure, which is constructed of its corresponding two or more of the holding solder parts 19 as holders 5, to be accurately positioned at a predetermined supporter position on the printed board 1, and is bonded onto the printed board 1. Thus, both the LED 2 and the light-transmissive part 3 are accurately positioned at their predetermined positions and fastened onto the printed board 1. Thus, a displacement of the LED 2 relative to the light-transmissive part 3 can be prevented. As a result, the light-transmissive part 3 of the LED light source 100 shown in FIG. 1 can guide light emitted by the LED 2 outward to provide a desired suitable light distribution pattern.

LED 2

Figure 3A:
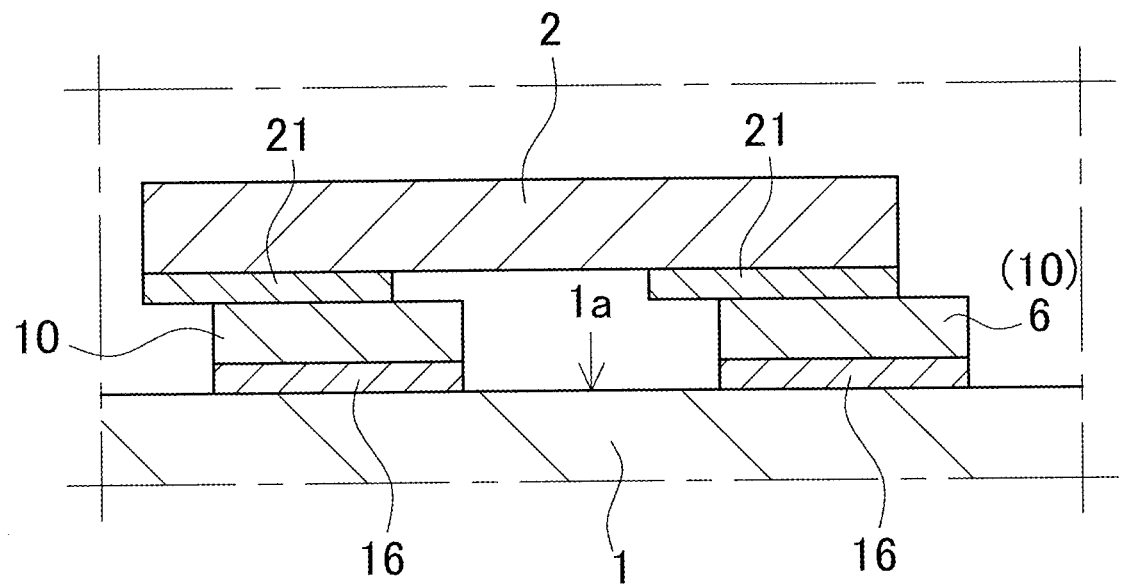
FIG. 3A is an enlarged cross-sectional view showing an LED which is positioned different from a desired position on a board.
Figure 3B:
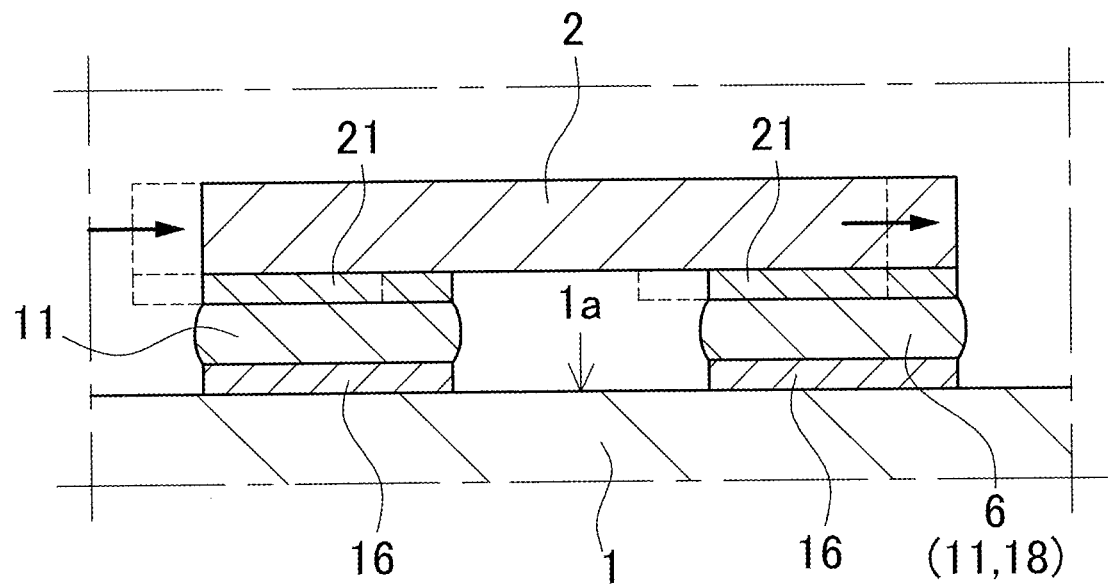
FIG. 3B is an enlarged cross-sectional view showing the LED which is shifted from the displaced position to the desired position on the board by its self-alignment function in soldering.

FIG. 3A is an enlarged cross-sectional view of an LED which is positioned different from a desired position on a board. FIG. 3B is an enlarged cross-sectional view showing the LED which is shifted from the displaced position to the desired position on the board by its self-alignment function in soldering. The LED 2 is soldered onto the printed board 1 as shown in the cross-sectional views of FIGS. 3A and 3B. As shown in FIG. 3A, a solder paste as the fasteners 6 is printed on electrode electrically conducting layer parts 16, which are formed on the first surface 1a of the printed board 1. The LED 2 is placed on the printed solder paste. The LED 2 has a square shape, which has an upper surface serving as a light emission surface and a bottom surface serving as an electrode surface. A pair of flat electrodes 21 are arranged on the electrode surface. Subsequently, as shown in FIG. 3B, the solder paste is melted by heat in a reflow soldering process so that the pair of flat electrodes 21 of the LED 2 are positioned at their predetermined positions by a self-alignment function provided by the melted solder and are soldered onto the printed board 1.

The enlarged cross-sectional view of FIG. 3A shows the LED 2 positioned different from a desired position on the printed board 1. When the LED 2 is placed by an LED feeder to position the flat electrodes 21 on the solder paste 10, a displacement of the LED 2 relative to the solder paste 10 may occur because the accuracy of the LED feeder is limited.

The solder paste 10 is melted in the reflow soldering process with the LED 2 being placed at the displaced position shown in FIG. 3A. The melted solder will extend along surfaces of the flat electrodes 21, and the flat electrodes 21 of the LED 2 are then drawn by a force acting on the surface of the melted solder 11 to minimize the area of the surface as surface tension so that the flat electrodes 21 are shifted to positions right above the electrode connection electrically conducting layer parts 16 as shown in the cross-sectional view of FIG. 3B. Surface tension is produced by attractive forces of molecules in the melted solder 11 as bonding solder parts 18 (intermolecular forces). As a result, even if the LED 2 is placed at a displaced position (shown in FIG. 3A) different from the desired position on the printed board, the LED 2 can be shifted to the desired position (shown in FIG. 3B) on the printed board. After the LED 2 is shifted to the position shown in FIG. 3B, the melted solder 11 is cooled and solidified so that the flat electrodes 21 are accurately fastened at their desired positions on the electrode electrically conducting layer parts 16. Thus, the LED 2 can be accurately arranged at the desired position on the printed board 1 by its self-alignment function effectively using surface tension of the melted solder 11.

Figure 4:
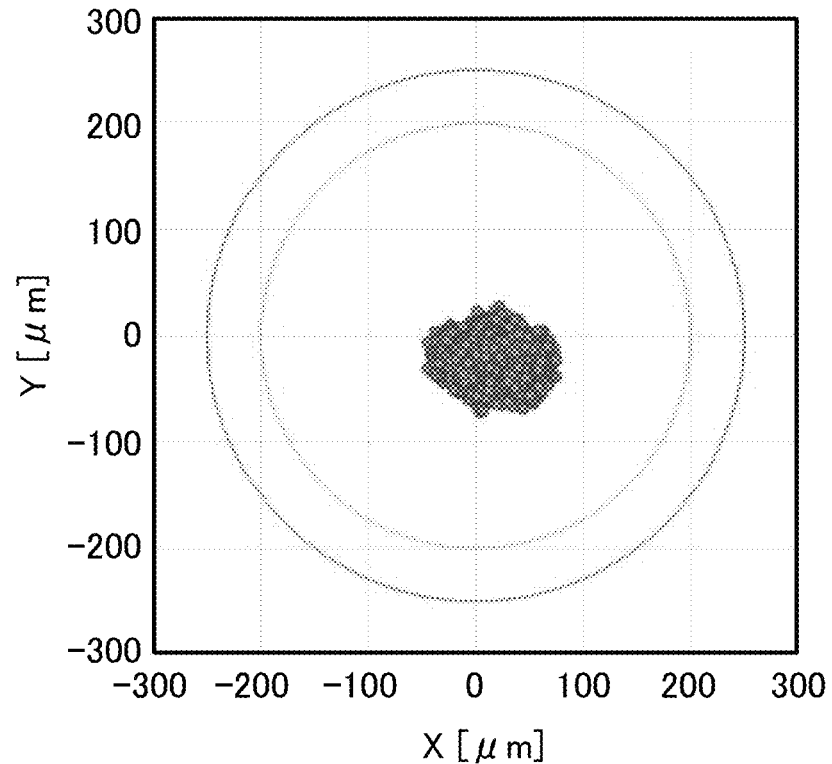
FIG. 4 is a graph showing arrangement distribution (accuracy) of LEDs with respect to a predetermined position on a board when the LEDs are arranged the board by their self-alignment function.
Figure 5:
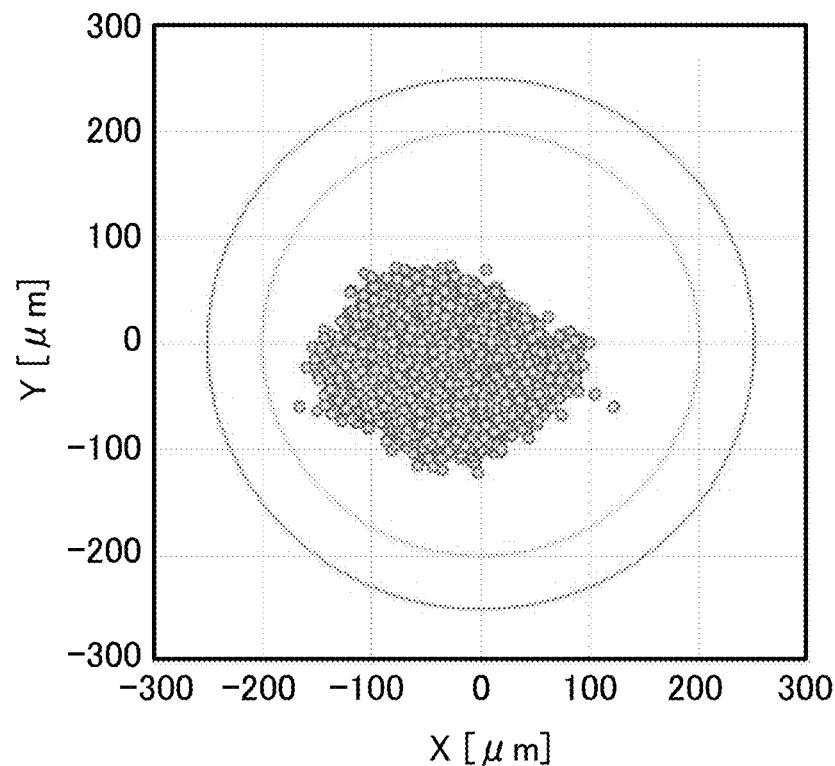
FIG. 5 is a graph showing arrangement distribution (accuracy) of light-transmissive parts with respect to a predetermined position on a board when the light-transmissive parts are placed on the board.
Figure 6:
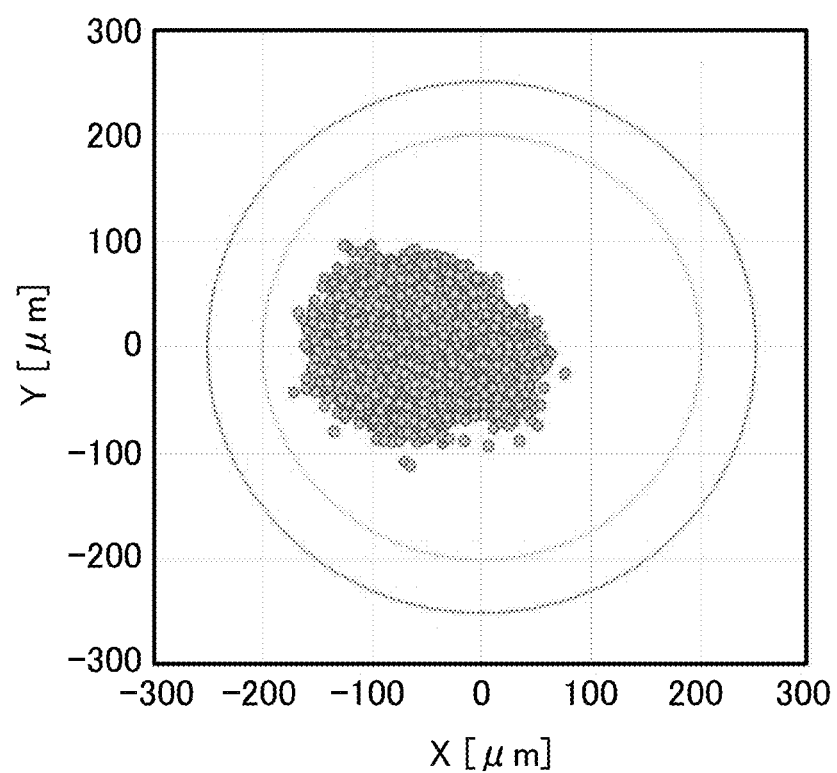
FIG. 6 is a graph showing the distribution of the accuracy of the optical axis by LED in FIG. 4 and its corresponding light-transmissive part shown in FIG. 5.

FIG. 4 is a graph showing arrangement distribution (accuracy) of LEDs with respect to a predetermined position on a board when the LEDs are arranged by their self-alignment function. FIG. 5 is a graph showing arrangement distribution (accuracy) of light-transmissive parts with respect to a predetermined position on a board when the light-transmissive parts are placed on the board. FIG. 6 shows the distribution of the accuracy of the optical axis by LED in FIG. 4 and its corresponding light-transmissive part shown in FIG. 5.

Points in the distribution shown in the graphs of FIGS. 4 and 5 are plotted as the positions of numbers of LEDs 2 and numbers of light-transmissive parts 3 when each LED 2 and each light-transmissive part 3 are intended to be fastened at their predetermined positions on the first surface 1a of the printed board 1 by using an automatic feeder. Points in the distribution shown in the graph of FIG. 6 are plotted as displacements (disagreement) between optical axes of each LED and its corresponding light-transmissive part. That is, the distribution in FIG. 4 shows plotted points of the numbers of LEDs 2, which are intended to be arranged at a predetermined position and actually fastened by their self-alignment, on the printed board 1. The distribution in FIG. 5 shows plotted points of the numbers of light-transmissive parts 3, which are intended to be arranged at a predetermined position and actually fastened after placed, on the printed board 1. As seen from FIGS. 4 and 5, although the LEDs 2 and the light-transmissive parts 3 are intended to be arranged at their predetermined positions by similarly constructed feeders with the same accuracy, the distribution of the plotted points corresponding to the secured LEDs 2 is included in a small area, which is defined by both X-directional and Y-directional displacements not greater than approximately 50 μm, by the LED self-alignment function, while the distribution of the plotted points corresponding to the secured light-transmissive parts 3 shows an X-directional displacement of 100 to 200 μm and a Y-directional displacement of approximately 100 μm. From FIGS. 4 and 5, it is found that, in the case in which the LEDs 2 and the light-transmissive parts 3 are intended to be arranged at their predetermined positions on the printed board 1 with the same accuracy, the positioning accuracy of the fastened LEDs 2 is increased by their self-alignment function using surface tension of the melted solder 11 more than twice as much as the fastened light-transmissive parts 3, which do not have such a self-alignment function.

Such a self-alignment function automatically adjusts arrangement of the fastened LED 2 by using a force acting on the surface of the melted solder 11 to minimize the area of the surface as surface tension of an exposed surface of the melted solder 11. The LED 2, which is arranged at its predetermined position by using its self-alignment function, preferably includes the flat electrodes 21 formed on the bottom surface of the LED 2. Thus, the flat electrodes 21, which are arranged on the bottom surface of the LED 2, accurately adjust an orientation and a position of the LED 2 by using their self-alignment function so that the LED 2 is arranged at its predetermined position on the surface of the printed board after secured. More specifically, in order to effectively adjust a position of the LED 2 by using such a self-alignment function, the flat electrodes 21 and the electrode connection layer parts 16 have a large area. Such large flat electrodes and electrode electrically conducting layer parts can increase an exposed surface area of the melted solder 11 to increase a force acting on the surface of the melted solder 11 to minimize the area of the surface as surface tension of the melted solder 11. For this reason, the total area of the pair of flat electrodes 21 of the LED 2 is preferably not smaller than a half the entire bottom surface of the LED 2. Such a large total area of the pair of flat electrodes 21 can surely provide a self-alignment function when the LED 2 is soldered onto the printed board 1. Each flat electrode 21 preferably has substantially the same shape and area as the electrode connection layer part 16 on the board surface. As a result, the same shape and area can facilitate positioning of the soldered LED 2 at the desired position by using a self-alignment function.

The LED 2 can be formed of a laminated semiconductor structure including a light emitting layer (hereinafter, also simply referred to as "laminated semiconductor structure"), or a laminated semiconductor structure with one or more wavelength conversion layers formed on its surface. Such a laminated semiconductor structure has certain light emission characteristics, and can be suitably constructed of a plurality of more semiconductor layers, such as ZnS, SiC, GaN, GaP, InN, AlN, ZnSe, GaAsP, GaAlAs, InGaN, GaAlN, AlInGaP, and AlInGaN layers, which are deposited on a substrate by liquid phase epitaxy, HDVPE, MOCVD, and the like. Any one or more of the semiconductor layers serve as a light-emitting layer. The light-emitting layer can have a desired light emission wavelength selected from a range from ultraviolet light to infrared light by suitably selecting materials and a crystal mixture ratio of semiconductors. In particular, in the case in which a light emitting device is intended to be suitably used outdoors, a high laminated semiconductor structure is required. In this case, a nitride semiconductor is preferably used for materials of a high power green or blue light-emitting layer. For example, $In_xAl_yGa_{1-x-y}N$ ($0 \le x \le 1$, $0 \le y \le 1$, $x+y \le 1$), and the like can be used as a material of the light emitting layer. The LED can be constructed of such a laminated semiconductor structure used together with various types of phosphors, which can be excited by light from the laminated semiconductor structure and emit light with a wavelength different from the wavelength of light emitted by the laminated semiconductor structure. In the case in which a plurality of phosphors are used, the plurality of phosphors can be included in one layer or separately included in two or more layers. GaAlAs-based semiconductors or AlInGaP-based semiconductors are preferably selected for a laminated semiconductor structure emitting red light. Also, if a light emitting device is used for a color display, the light emitting device preferably includes laminated semiconductor structures emitting red, green, and blue light having wavelength ranges of 610 to 700 nm, 495 to 565 nm, and 430 to 490 nm, respectively.

The electrodes of the LED 2 are formed on one surface of such a laminated semiconductor structure. An electrode formation surface of the laminated semiconductor structure on which its electrodes are formed faces the printed board 1 when the LED 2 is placed on the printed board 1 so that the LED 2 is fastened by using melted solder. In other words, the LED 2 is installed in a facedown mounting (so-called flip chip mounting) manner in which a surface of the laminated semiconductor structure opposite to the electrode formation surface serves as a main light emission surface.

Light-Transmissive Part 3

The light-transmissive part 3 is arranged right above the LED 2 so that an optical axis of the light-transmissive part 3 agrees with an optical axis of the LED 2. Thus, light incident from the LED 2 is diffused or collected in a desired light emission pattern. More specifically, the light-transmissive part 3 refracts and outwardly directs the light incident from the LED 2 in a light distribution pattern suitable for particular use of the LED light source 100. An optical part such as optical lens can be suitably used as the light-transmissive part 3. A concave or convex lens can be used for such an optical lens as the light-transmissive part 3. Thus, a light distribution pattern designed for the particular use can be provided by the light-transmissive part 3, which is secured onto the printed board 1 so that the optical axis of the light-transmissive part 3 agrees with the optical axis of the LED 2. To provide such a particular light distribution pattern, the light-transmissive part 3 can have a concave or convex shape on its exterior surface side to refract and outwardly direct the light incident from the LED 2. When fastened onto the printed board 1, the light-transmissive part 3 is necessarily positioned relative to the printed board 1 so as not to be positioned different from a predetermined position with respect to the LED 2. In a process of soldering the LED 2 to the printed board 1, the LED 2 can be accurately arranged at a predetermined LED position on the printed board 1 by a self-alignment using the melted solder 11 when soldered. Contrary to this, the light-transmissive part 3 is bonded onto the printed board 1 by the adhesive 30. Such bonding does not provide a self-alignment function. For this reason, it is very difficult to position the light-transmissive part 3 at the predetermined position with high accuracy. The distribution in FIG. 5 shows plotted points of numbers of light-transmissive parts 3, which are intended to be arranged at a predetermined position on the printed board 1. But the plotted points show that their centers are displaced from their predetermined position. As seen from FIG. 5, a displacement of the light-transmissive part 3, which does not have a self-alignment function, fastened on to the printed board 1 is greater than the LED 2. A displacement of the LED 2 increases an optical-axis displacement from the optical axis of the light-transmissive part 3 as shown by plotted points representing such optical-axis displacements in the distribution of FIG. 5. In other words, the displacement of the light-transmissive part 3 causes deformation of the light distribution pattern designed for the particular use.

Figure 2:
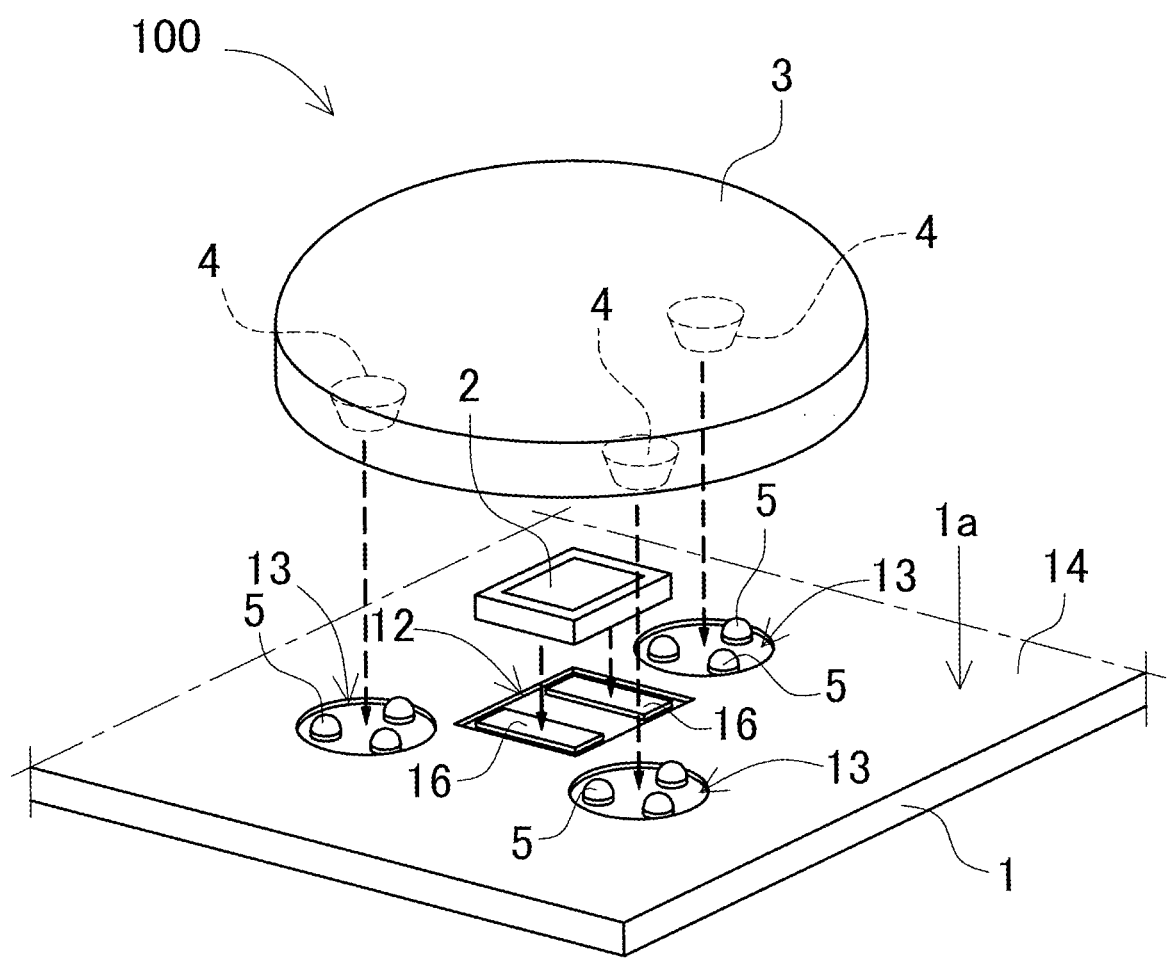
FIG. 2 is an exploded perspective view of the LED light source according to the certain embodiment of the present disclosure.

The light-transmissive part 3 shown in the perspective view of FIG. 2 includes a plurality of supporters 4 to position the light-transmissive part 3 at a predetermined position on the printed board 1 with high accuracy when secured. The supporters 4 are formed of a light-transmissive resin, such as acrylic resin or silicone resin, as a material of the light-transmissive part 3, and are integrally formed with the light-transmissive part 3. It is noted that the present invention is not limited to an integral structure of the supporters and the light-transmissive part. The supporters may be formed separately from the light-transmissive parts. The supporters 4 are formed in the non-facing area 3B, which does not face a surface of the LED 2, on the board-facing surface 3A of the light-transmissive part 3 (lower surface in FIG. 1), and protrude toward the printed board 1. An end of each supporter 4 arranged in the non-facing area 3B is bonded to the first surface 1a of the printed board 1 on the exterior side with respect to the LED 2 so that the light-transmissive part 3 is orientated in parallel to the printed board 1 and the optical axis of the light-transmissive part 3 agrees with the optical axis of the LED 2. The printed board 1 includes lens-fastening lands 13 in areas onto which the lower ends of the supporters 4 are bonded. Each lens-fastening land 13 corresponds to an area where a solder resist 14 covering the surface of the printed board 1 is not applied. Two or more of a number of holders 5 (discussed later) are arranged in each lens-fastening land 13 so that corresponding one of the supporters 4 are bonded in a central part of a holding structure, which is constructed of the two or more of the number of holders 5. The solder resist 14 is applied on roughly the entire surface of the printed board 1 so as not to cover the lens-fastening lands 13 and an LED-fastening land 12 in which the LED 2 is fastened onto the printed board 1. In the case in which the solder resist 14 is white, the white solder resist 14 reflects light emitted by the LED 2. In this case, brightness of the LED light source 100 can be improved.

A clearance between the light-transmissive part 3 and the board surface can be dimensioned by a length of the supporter 4. The supporter 4 has a length that brings a lower surface of the light-transmissive part 3 in contact with or in proximity to the upper surface of the LED 2 depending on the material of the light-transmissive part 3. The length of the supporter 4 is dimensioned to minimize the clearance between the light-transmissive part 3 and the surface of LED 2. Thus, light emitted by the LED 2 enters the light-transmissive part 3. In the case in which the light-transmissive part 3 includes three or more supporters 4, the light-transmissive part 3 can be secured onto and parallel to (in parallel orientation) the printed board 1 by bonding end surfaces 4A of the three or more supporters 4 to the board surface. The light-transmissive part 3 includes a plurality of supporters 4, which are arranged along a ring shape or a polygonal shape centering the LED 2. In this arrangement, the light-transmissive part 3 can be arranged at a predetermined position and in a predetermined orientation with high accuracy on the printed board 1 by bonding the plurality of supporters 4 to the printed board 1. Although the light-transmissive part 3 illustratively includes three supporters 4 in the embodiment shown in FIG. 2, the light-transmissive part can include four or more supporters 4.

Figure 7:
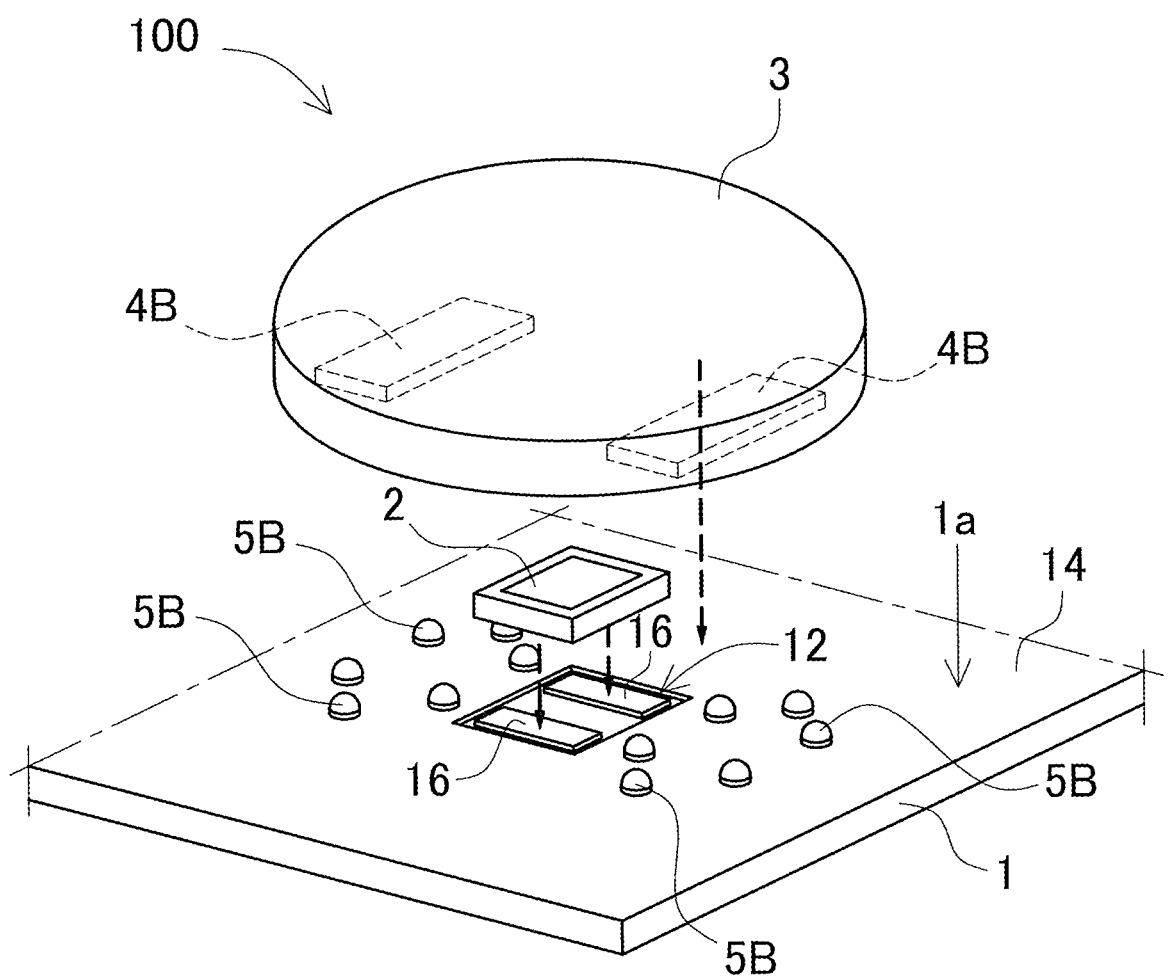
FIG. 7 is an exploded perspective view showing an LED light source according to a modified embodiment of the present disclosure.

FIG. 7 is an exploded perspective view showing an LED light source according to a modified embodiment of the present disclosure. In the modified embodiment shown in FIG. 7, two supporters 4B are arranged at positions symmetric with respect to the LED 2. Each supporter 4B has a large lower end surface. Thus, the light-transmissive part 3 can be arranged at a predetermined position and in a parallel orientation with accuracy on the printed board 1 by holding each supporter by two or more holders 5B. The light-transmissive part 3 can be fastened onto the printed board 1 by bonding the end surface 4A of each supporter 4 to the lens-fastening land 13 by using the adhesive 30 or by bonding the end surface 4A of each supporter 4 and its neighboring part to the surface of the printed board 1.

The supporter 4 preferably has a tapered peripheral surface, which becomes smaller toward the end surface 4A as shown in a partially enlarged cross-sectional view of FIG. 1. In the case in which the supporter 4 has such a tapered peripheral surface in other words an inclined surface, the inclined surface can be smoothly inserted into a space between the holders 5 so that the supporter 4 can engage the holding structure. In addition to such smooth engagement of the supporter by two or more holders 5, such smooth insertion of the inclined surface positions the supporter 4 at its predetermined supporter position by a self-alignment function of the inclined surface. As a result, the light-transmissive part can be smoothly and accurately arranged at a predetermined position. Also, the supporter 4 has a rounded corner between the peripheral surface and the end surface 4A as shown in the partially enlarged cross-sectional view of FIG. 1. This supporter 4 can be smoothly guided by the holding structure and engage the holding structure without the end part of the supporter 4 being caught on the holder 5.

Printed Board 1

The printed board 1 has an electrically insulating flat surface, and includes a wiring layer (not shown), which is arranged on the electrically insulating flat surface. The wiring layer includes the electrode connection layer parts 16 each of which is electrically connected to corresponding one of the electrodes of the LED 2. A heat-dissipative electrically insulating board is suitably used for the printed board 1. For example, a ceramic board can be used for the printed board. More specifically, an alumina ceramic board can be used for the printed board 1 in this embodiment. Alternatively, a glass epoxy board, aluminum nitride board, or the like can be suitably used for the printed board.

Also, the printed board 1 includes the electrically connected electrically conducting layer 15 parts, which are arranged on the surface of the printed board 1 as shown in FIG. 1. Two (electrode connection layer parts 16) of the electrically conducting layer 15 parts are electrically connected to the LED 2. In order to increase light emission efficiency, the printed board 1 further includes the light-reflective solder resist 14 in areas excluding the LED-fastening and lens-fastening lands 12 and 13 to which the LED 2 and the supporters 4 of the light-transmissive part 3 are fastened/bonded. The light-reflective solder resist 14 is formed of an electrically insulating material. In the case in which the printed board 1 includes a plurality of LED 2 on the surface of the printed board 1, the printed board 1 can include a corresponding number of LED-fastening lands 12. Two or more lens-fastening lands 13 can be arranged around each LED-fastening land 12.

The electrode connection layer parts 16 are exposed in the LED-fastening land 12 to be connected to the electrodes of the LED 2 by soldering. A pair of electrode connection layer parts 16 are arranged in the LED-fastening land 12. The pair of electrode connection layer parts 16 are arranged at positions each of which faces corresponding one of the two flat electrodes 21 arranged on the bottom surface of the LED 2. In a surface mount process, the solder paste 10 is applied on the surface of each electrode connection layer part 16 by printing. The LED 2 is placed on the solder paste 10 so that each of the two flat electrodes 21 is bonded to the corresponding electrode connection layer part 16. Thus, the LED 2 is intended to be temporarily held at a predetermined position. After the temporary bonding, the solder paste 10 is heated by a heating method such as reflow soldering so that the heated solder paste 10 is melted. Thus, the flat electrodes 21 of the LED 2 are fastened onto the electrode connection layer parts 16 by soldering. More specifically, each flat electrode 21 of the LED 2 is accurately moved to its predetermined position right above corresponding one of the electrode connection layer parts 16 by a self-alignment function using surface tension of the melted solder. Subsequently, the solder is cooled to be solidified. As a result, each flat electrode 21 is fastened onto corresponding one of the electrode connection layer parts 16.

The LED 2 is soldered onto the printed board 1 so that each of the two flat electrodes 21 is arranged at a position right above corresponding one of the electrode connection layer parts 16 by a self-alignment function. Thus, a suitable distribution pattern can be provided to the LED light source 100 by agreeing the optical axis of the light-transmissive part 3 with the optical axis of the LED 2 when fastening the LED 2 and the light-transmissive part 3 onto the printed board 1. As stated above, the LED 2 can be accurately arranged at a desired position on the printed board 1 by a self-alignment. Contrary to this, the light-transmissive part 3 does not have such a self-alignment function when fastened onto the printed board 1. To address this, each lens-fastening land 13 includes two or more holders 5, which hold corresponding one of the supporters 4 of the light-transmissive part 3 at its predetermined supporter position by using the holding structure. As a result, the light-transmissive part 3 can be arranged in its desired position on the printed board 1 when each supporter 4 engages the corresponding two or more holder 5 by using the holding structure. Because a displacement of the light-transmissive part 3 from the predetermined position is limited by designed positions of the holders 5, positioning accuracy of the light-transmissive part 3 on the printed board 1 can be improved.

In order to provide very high positioning accuracy to the light-transmissive part 3 on the printed board 1, two or more holders 5 each of which is formed of corresponding one of the holding solder parts 19 are arranged in each lens-fastening land 13. Also, in order to prevent the displacement of the holders 5 with respect to the LED 2, in the surface mount process, the holders 5 are formed at their predetermined holder positions in the lens-fastening land 13. In the surface mount process, the solder paste 10 is arranged on the electrode connection layer parts 16 in the LED-fastening land 12 and holder-placement electrically conducting layer parts 17 in the lens-fastening lands 13 by printing, and the solder paste 10 is subsequently melted by heating. Thus, the LED 2 is accurately soldered onto a predetermined LED position by a self-alignment function in cooperation with the melted solder 11. Also, the melted solder paste 10 on the holder-placement layer parts 17 is then solidified so that the holders 5 are formed.

Figure 8:
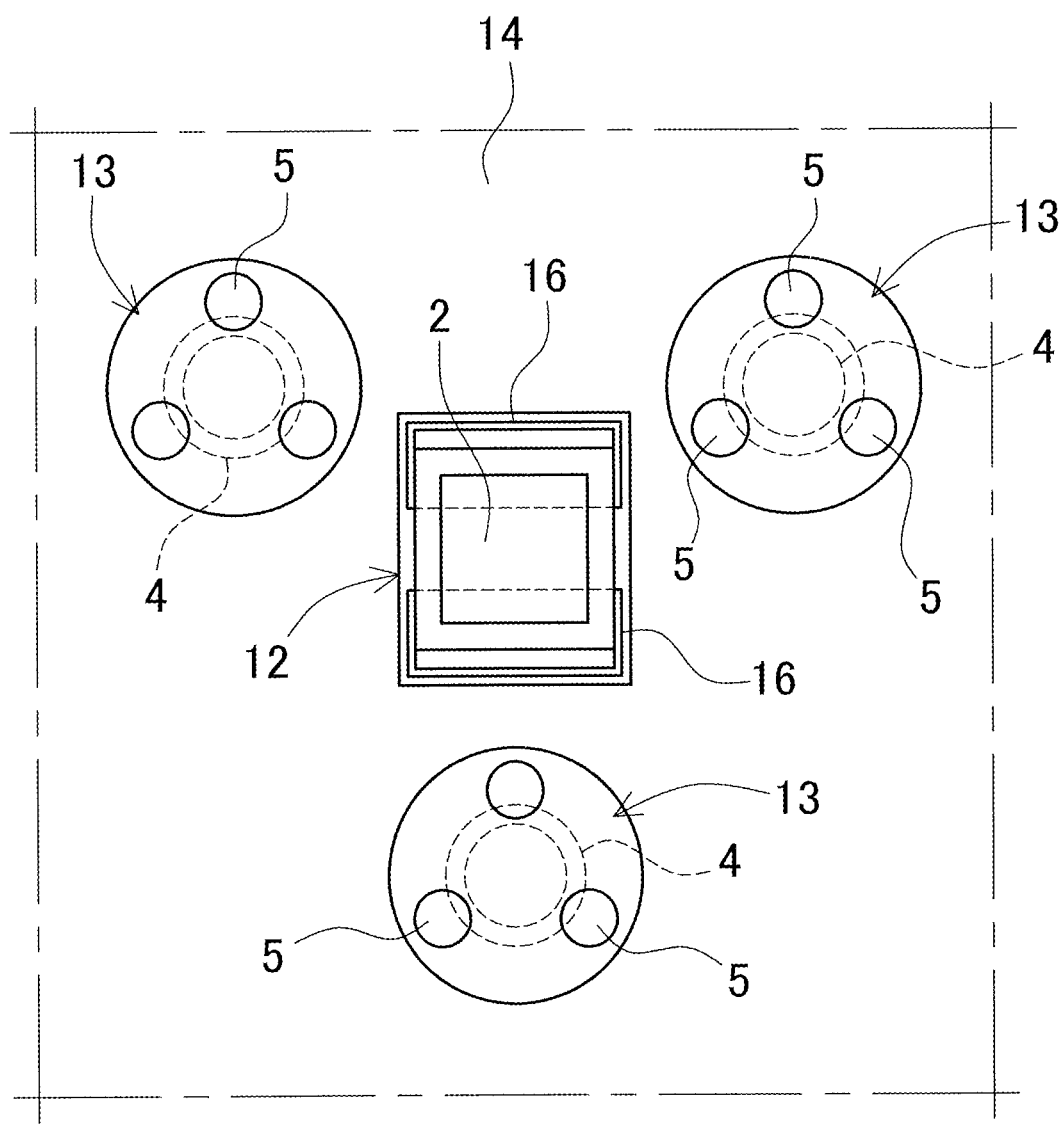
FIG. 8 is a plan view of a board of the LED light source shown in FIG. 2.
Figure 9:
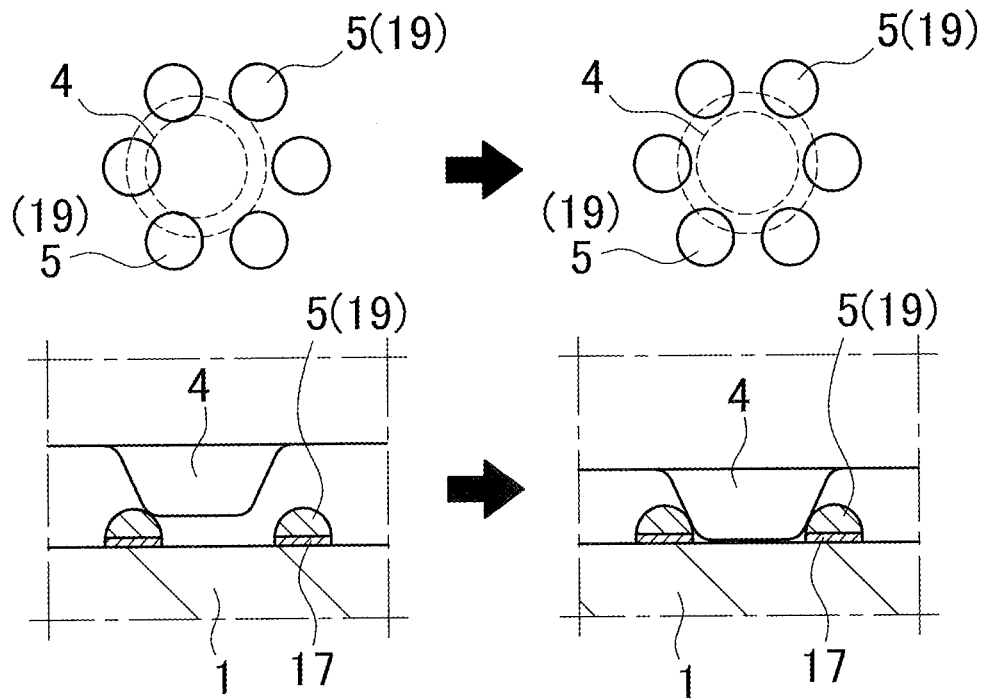
FIG. 9 includes plan views and cross-sectional views showing exemplary positioning of a supporter of a light-transmissive part by using holders in an LED light source according to a modified embodiment.
Figure 10:
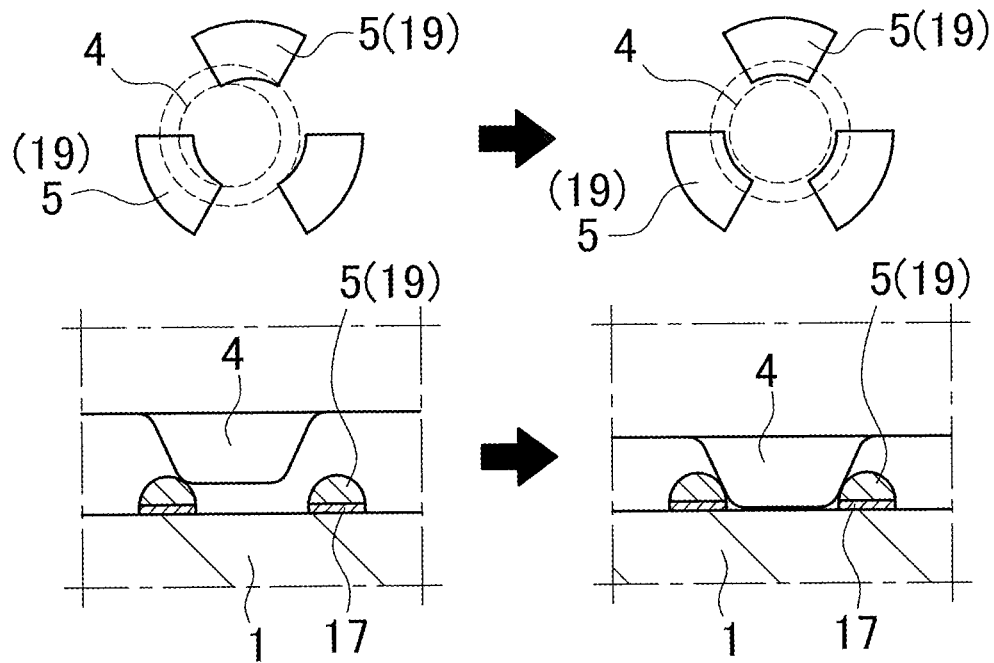
FIG. 10 includes plan views and cross-sectional views showing another exemplary positioning of a supporter of a light-transmissive part by using holders in an LED light source according to a modified embodiment.

FIG. 8 is a plan view of a board of the LED light source shown in FIG. 2. FIG. 9 includes plan views and cross-sectional views showing exemplary positioning of a supporter of a light-transmissive part by using holders in an LED light source according to a modified example 1. FIG. 10 includes plan views and cross-sectional views showing another exemplary positioning of a supporter of a light-transmissive part by using holders in an LED light source according to a modified example 2.

It is noted that although the printed board 1 of the LED light source 100 according to the first embodiment shown in FIGS. 2 and 8 includes three holders 5 in each lens-fastening land 13, the number of holders in each lens-fastening land in the present disclosure is not limited to three but can be four or more. For example, six holders 5 can be arranged along a ring shape in a lens-fastening land 13 of the LED light source according to the modified example 1 as shown in the plan view of FIG. 9. In the case in which a greater number of holders 5 are arranged in a ring shape as a structure that guides the supporter 4 into a space surrounded by these holders 5 arranged in the ring shape and hold the supporter 4 by a holding structure in which the holders 5 engage the supporter, the supporter 4 can be more accurately arranged at a predetermined position in the lens-fastening land 13. It is noted that although each holder 5 has a circular shape as viewed in a plan view of FIG. 9, the holder in the present disclosure does not necessarily have such a circular shape. For example, the holder 5 can have an arc shape, which extends along a part of an outer peripheral edge of the supporter 4 as shown in the plan view of FIG. 10 showing the LED light source according to the modified example 2.

Figure 11:
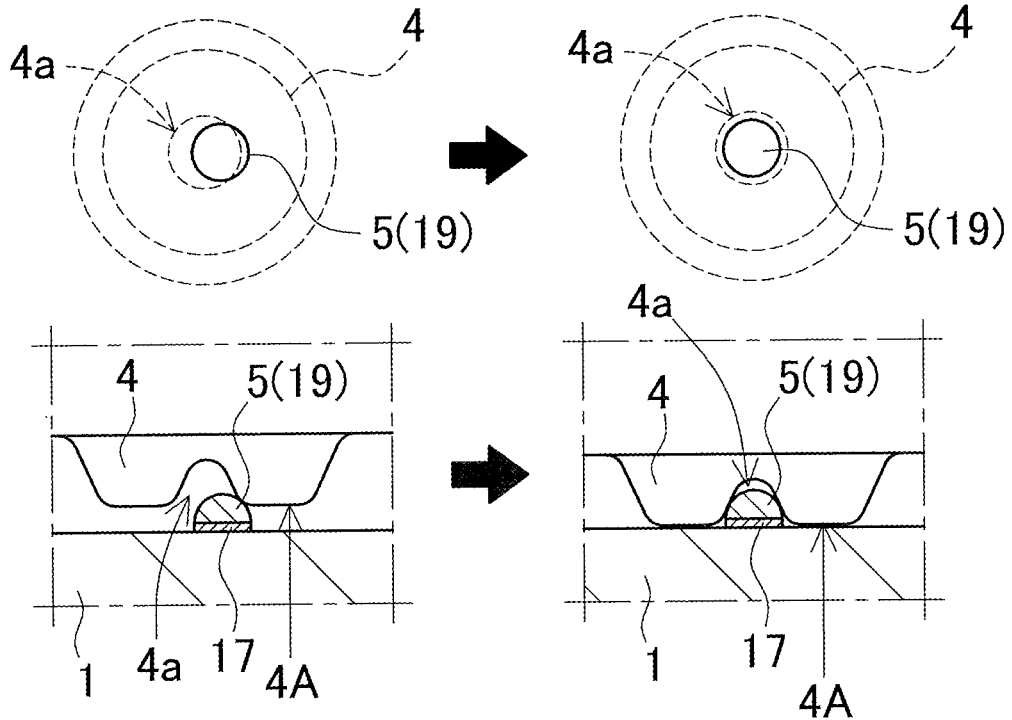
FIG. 11 includes plan views and cross-sectional views showing another exemplary positioning of a supporter of a light-transmissive part by using a holder in an LED light source according to certain embodiment.

Alternatively, the supporter may have a shape that surrounds the holder. FIG. 11 includes plan views and cross-sectional views showing another exemplary positioning of a supporter 4 of a light-transmissive part by using a holder 5 in an LED light source according to a second embodiment. The supporter 4 has a recessed part in its central part to surround the single holder 5, which has a circular shape, in the LED light source according to the second embodiment shown in FIG. 11.

The holder 5 is formed of the solder paste 10 that is applied on the holder-placement layer part 17 and then melted. The melted solder 11 will be shaped in a roughly semicircular shape as viewed in cross-sectional views of FIGS. 9 to 11 by a force acting on the surface of the melted solder 11 to minimize the area of the surface as surface tension. Thus, this holder 5 becomes wider toward the printed board 1. Because the holders 5 have an inclined outer peripheral surface, the supporter 4 will be shifted to a center of an area surrounded by the holders 5 arranged in a ring shape if displaced from the center, in other words, the supporter 4 can be accurately arranged at its predetermined position by a self-alignment function in cooperation with the inclined outer peripheral surfaces of the holders 5. Thus, each supporter 4, which is integrally formed with the light-transmissive part 3, is arranged at the center of the area surrounded by two or more holders 5 arranged in a ring shape by a self-alignment function in cooperation with the holders 5. As a result, the light-transmissive part 3 can be accurately arranged at its predetermined position on the printed board 1 by engagement of each supporter 4 with two or more holders 5 (holding structure). In particular, in the case in which each supporter 4 is held by a certain number of holders 5 to be arranged at its predetermined position on the printed board 1 by a self-alignment function in cooperation with such a certain number of holders 5, the light-transmissive part 3 can be fastened at its predetermined position on the printed board 1 with very high accuracy.

Figure 12:
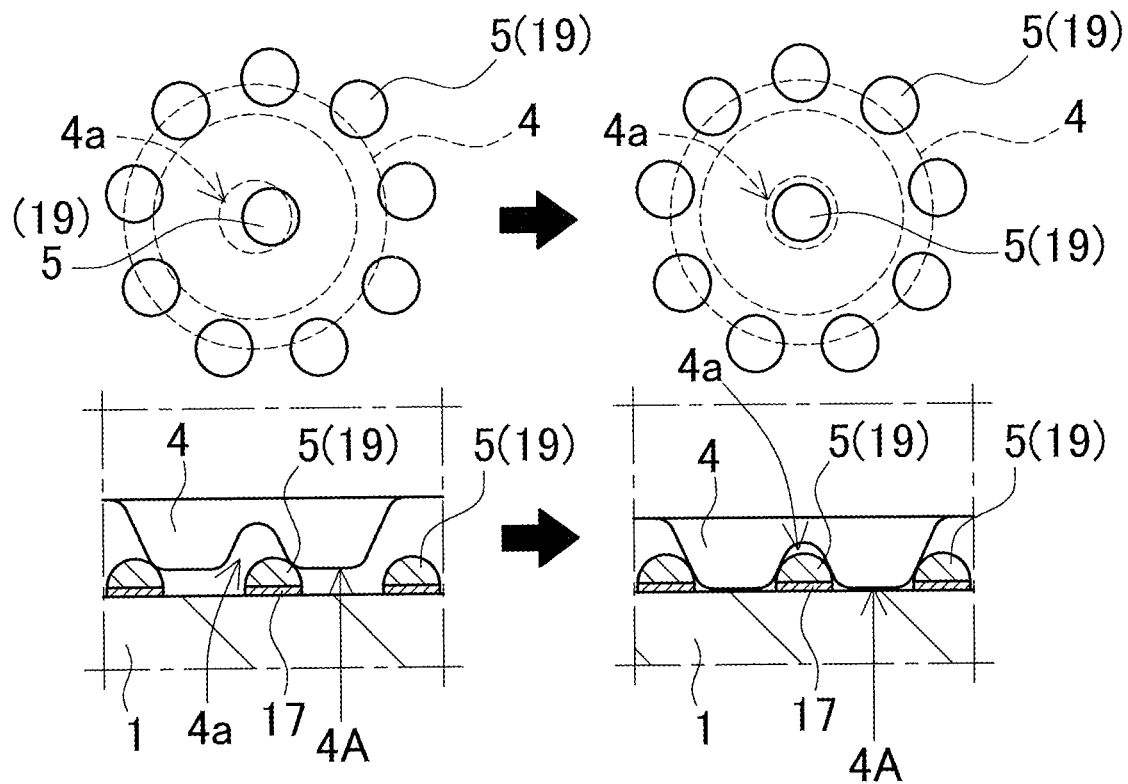
FIG. 12 includes plan views and cross-sectional views showing another exemplary positioning of a supporter of a light-transmissive part by using holders in an LED light source according to a modified example of the certain embodiment.

Six holders 5 are arranged along a ring shape or a polygonal shape in the lens-fastening land 13 shown in FIG. 9 so that the light-transmissive part 3 is held at its predetermined position on the printed board 1 by positioning the supporter 4 in the ring shape or polygonal shape. Three holders 5 are arranged along a ring shape or polygonal shape in the lens-fastening land 13 shown in FIG. 10. Each holder 5 has an inner peripheral edge that extends along a part of the outer peripheral edge of the supporter 4. The inner peripheral edge of the holder 5 faces toward a center of the ring shape. The light-transmissive part 3 is held at its predetermined position on the printed board 1 by positioning the supporter 4 in an area surrounded by the holders 5. FIG. 12 includes plan views and cross-sectional views showing another exemplary positioning of a supporter 4 of a light-transmissive part by using holders in an LED light source according to a modified example of the second embodiment. A greater number (greater than the foregoing examples) of holders 5 are arranged along a ring shape (also referred to herein as "additional holders" that are provided in addition to the holder at the center of the ring shape) in a lens-fastening land 13 according to the modified example of the second embodiment shown in FIG. 12 to hold the supporter 4 in the ring shape. The supporter 4 has an engagement recessed part 4a in an end surface 4A of the supporter 4. In addition to the greater number of holders 5, another holder 5 is arranged at a center of the ring shape of the greater number of holders 5 to be inserted into the engagement recessed part 4a. That is, a number of peripheral holders 5 that are arranged along a ring shape and a center holder 5 that is arranged at a center of the ring shape are provided in the lens-fastening land 13. According to this arrangement, in addition to positioning of the supporter 4 at its predetermined position by using the number of peripheral holders 5 arranged along the ring shape, the engagement recessed part 4a in the end surface 4A of the supporter 4 is positioned by the center holder 5 arranged in the center of the ring shape. As a result, the supporter 4 can be more accurately held at its predetermined position on the printed board 1. In the case in which a supporter 4 has an engagement recessed part 4a in an end surface 4A of the supporter 4, even a single holder 5 (that is, a number of holders 5 arranged along a ring shape are not included dissimilar to the modified example shown in FIG. 12) can position the supporter 4 at a predetermined position.

Because the surface electrode connection layer part 16 and the holder-placement layer part 17 on the printed board 1 can be formed at one time by partially removing an electrically-conducting layer 15 formed on the surface of the printed board 1 by etching, a displacement of the electrode connection layer parts 16 and the holder-placement layer parts 17 from each other is very small. As a result, the electrode connection layer parts 16 and the holder-placement layer parts 17 can be simultaneously formed on the board surface to eliminate a relative displacement.

Because the solder paste 10 is also simultaneously applied on surfaces of the electrode connection layer parts 16 and the holder-placement layer parts 17 by printing, the solder paste 10 parts on the electrode connection and holder-placement layer parts 16 and 17 can be arranged without a displacement relative to each other. After that, the solder paste 10 parts are melted by heating in the reflow soldering process in which the LED 2 is soldered onto the printed board 1 so that the LED 2 can be accurately soldered at its predetermined position on the printed board 1 by a self-alignment function. The holders 5 can be accurately arranged at their predetermined position by simultaneously melting and then solidifying the solder paste 10 parts on the holder-placement layer parts 17 in the reflow soldering process. Because the holders 5 are formed from solder simultaneously when the LED 2 is soldered to prevent a displacement of the holders 5 relative to the LED 2 as discussed above, both the light-transmissive part 3 and the LED 2 can be fastened at their predetermined positions on the printed board 1 with very high accuracy. As a result, a displacement of the light-transmissive part 3 and the LED 2 relative to each other can be fastened. As an additional advantage, an additional process is not required to form the holders 5 at predetermined positions relative to the LED 2 with very high accuracy.

The holder-placement layer parts 17 can be formed together with the electrode connection layer parts 16 without a displacement from the electrode connection layer parts 16 by etching the electrically-conducting layer 15 on the board surface. The solder paste 10 parts can be applied on both the electrode connection layer parts 16 and the holder-placement layer parts 17 without a displacement by printing. The solder paste 10 parts both on the electrode connection layer parts 16 and the holder-placement layer parts 17 are simultaneously heated so that the holders 5 can be formed from the solder paste when the LED 2 is soldered in the LED 2 soldering process. For these reasons, according to the aforementioned LED light source 100 and a method of manufacturing the LED light source 100, both the LED 2 and the light-transmissive part 3 can be fastened at their predetermined positions on the printed board 1 with high positional accuracy particularly to prevent a relative displacement (positional deviation).

As a result, the optical axes of the LED 2 and the light-transmissive part 3, which are fastened onto the printed board 1, can accurately agree with each other. This feature provides ideal characteristics to applications in which a particular light distribution pattern is realized by the light-transmissive part 3, which refracts light emitted by the LED 2. For example, in an application in which the LED light source is used for a backlight of a liquid crystal display, the light-transmissive part serves as a secondary lens that directs light emitted by the LED outward to provide even light distribution through the secondary lens. As a result, the liquid crystal display can have reduced light unevenness. Also, in an application in which the LED light source is used for a car headlight that collects LED light, the light-transmissive part is used to collect light emitted by the LED into a particular focused light beam. As a result, the car headlight can brightly illuminate the road ahead.

LED Light Source Manufacturing Method

Figure 13:
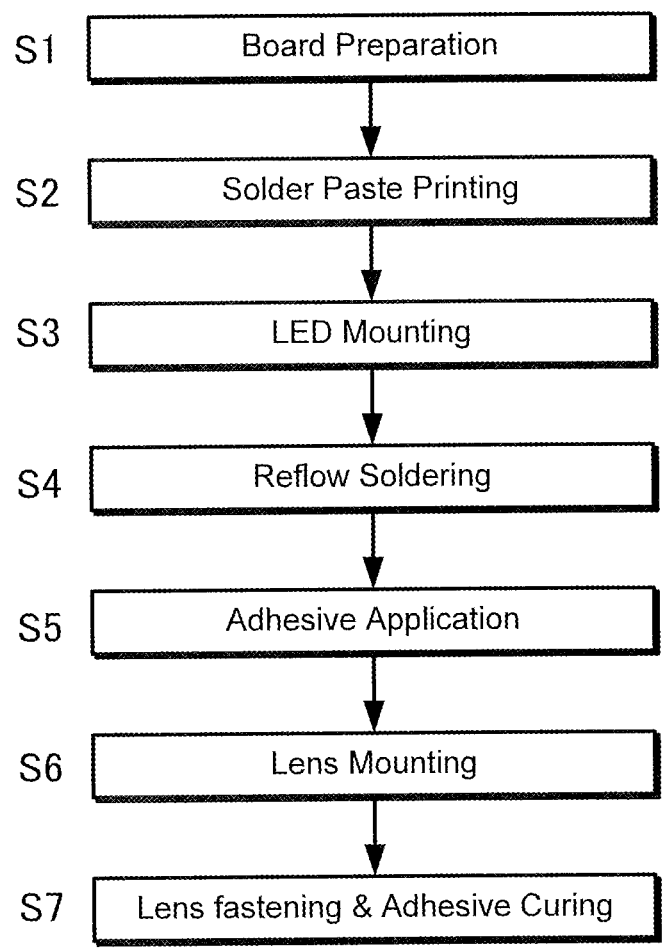
FIG. 13 is a flowchart showing processes of manufacturing an LED light source.

The following description describes a method of manufacturing of an LED light source with reference to FIG. 13, and FIGS. 14A to 14F. FIG. 13 is a flowchart showing processes of manufacturing the LED light source. FIGS. 14A to 14F are schematic views showing processes of manufacturing the LED light source according to an embodiment.

Step S1

Figure 14A:
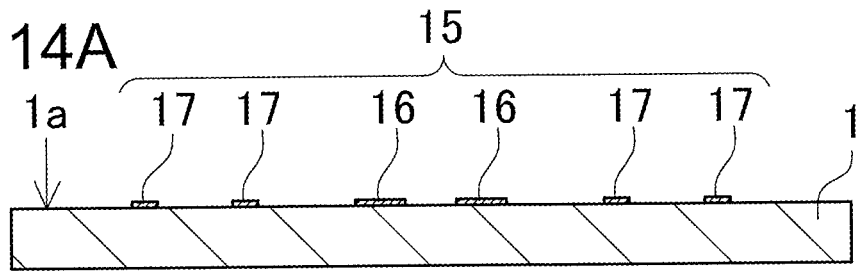
FIGS. 14A to 14F are schematic views showing processes of manufacturing the LED light source according to an embodiment.

A printed board 1 is first prepared in Step S1. An electrically-conducting layer 15 on a surface of the printed board 1 can be manufactured by conventional processes of manufacturing a printed board. For example, electrode connection layer parts 16 and holder-placement layer parts 17 can be formed by partially removing the electrically-conducting layer 15 by etching as shown in FIG. 14A. The electrode connection layer parts 16 are formed at positions facing flat electrodes 21 of an LED 2. The holder-placement layer parts 17 are formed at positions each of which a holder 5 is formed on. In the case in which a plurality of LEDs 2 are spaced at a predetermined pitch from each other on the surface of the printed board 1, a plurality of electrode connection layer parts 16 are formed so that each electrode connection layer part 16 is arranged its predetermined position facing corresponding one or more of the flat electrodes 21 of the LEDs 2. In other words, the plurality of electrode connection layer parts 16 are formed in a predetermined wiring pattern so that the plurality of LEDs 2 are connected in parallel and/or serial to each other. The holder-placement layer parts 17 do not serve as an electrical connection part in the electrically-conducting layer 15 parts. For this reason, the holder-placement layer parts 17 are not necessarily connected to the electrode connection layer part 16. However, one or more of the holder-placement layer parts 17 may be connected to the electrode connection layer part 16. The holder-placement layer parts 17 are arranged at their predetermined position to hold supporters 4 of a light-transmissive part 3 at predetermined supporter positions by holding structures.

In the etching on the printed board 1, for example, a photosensitive resist film on the board surface is irradiated with (exposed to) ultraviolet rays with an artwork film being arranged on a surface of the photosensitive resist film so that irradiated areas with the ultraviolet rays are cured and non-irradiated areas are not cured. Subsequently, the non-cured areas are removed by etching, and the film is then removed. Thus, the electrode connection layer parts 16 and the holder-placement layer parts 17 are formed on the surface of the printed board 1.

Step S2

Figure 14B:
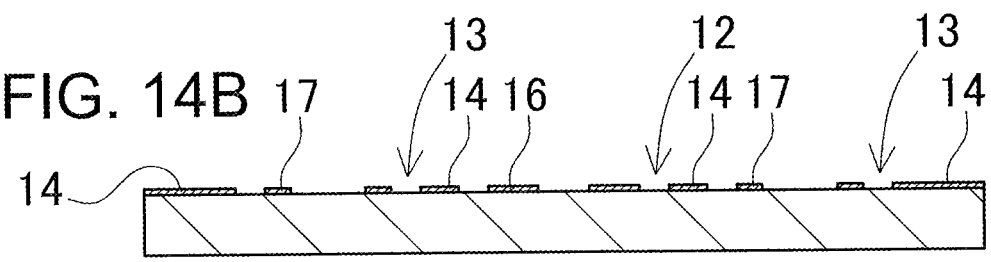
Figure 14C:
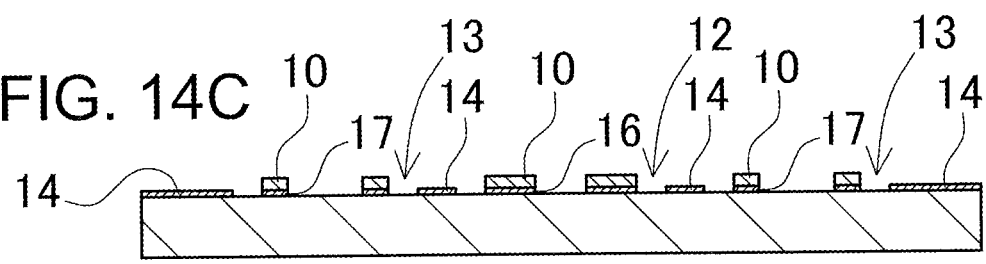

A solder paste 10 is printed in Step S2. In this step, a solder resist 14 is applied on the surface of the printed board 1 as shown in FIG. 14B. The solder resist 14 is applied not entirely on the surface of the printed board 1 but to expose the LED-fastening land 12 in which the LED 2 is formed and the lens-fastening lands 13 each of which two or more of a number of holders 5 are formed in. In addition, the solder paste 10 is applied on a surface of each electrode connection layer part 16 and a surface of each holder-placement layer part 17 by printing as shown in FIG. 14C. A height of each holder 5 can be adjusted in accordance with an application amount of the solder paste 10 in this process. For example, a thickness of the solder paste 10 can be 0.2 mm (printing process). In this case, the LED 2 is surely soldered onto the electrode connection layer parts 16, and the holders 5 as holding structures hold supporters 4 at the predetermined positions.

Step S3

Figure 14D:
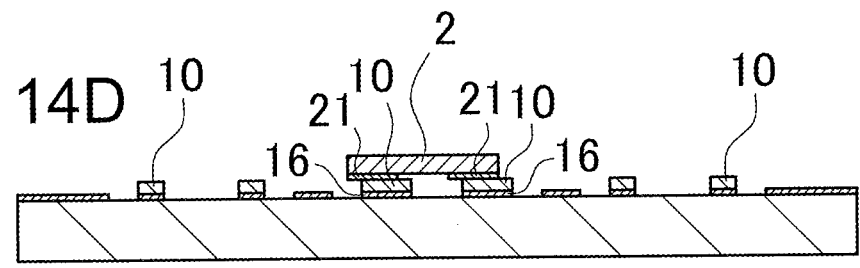

The LED 2 is mounted in Step S3. In this step, the flat electrodes 21 of the LED 2 are attached onto the solder paste 10 parts on the electrode connection layer parts 16 so that the LED 2 is temporarily held as shown in FIG. 14D.

Step S4

Figure 14E:
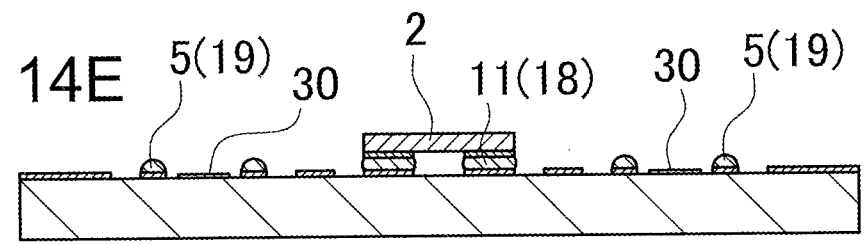

Reflow soldering is implemented in Step S4. The solder paste 10 that attaches the LED 2 is melted by heating and then solidified so that the LED 2 is soldered at its predetermined position on the printed board 1, and the solder paste on the holder-placement layer parts 17 is simultaneously melted and then solidified so that the holders 5 are formed on the surfaces of the holder-placement layer parts 17 as shown in FIG. 14E in this step.

Step S5

An adhesive 30 is applied in Step S5. Specifically, after reflow soldering is implemented as shown in FIG. 14E, the adhesive 30 is applied at predetermined positions each of which the supporter 4 of the light-transmissive part 3 as a lens is to be arranged on. The adhesive 30 is applied on the lens-fastening lands 13 to fasten the light-transmissive part 3 onto the printed board 1. A non-cured, liquid or paste epoxy resin is used as the adhesive 30. A thermosetting resin, which will be cured by heating, a UV-curable resin, which will be cured by ultraviolet rays, or the like is suitably as the adhesive 30.

Step S6

Figure 14F:
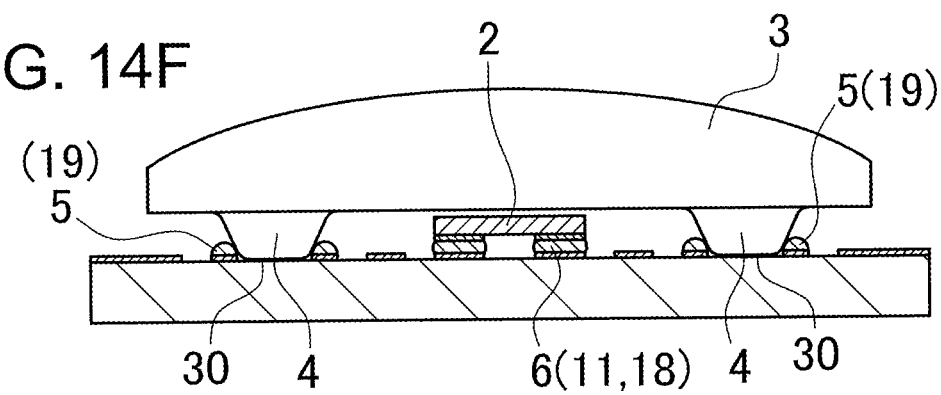

The lens is mounted in Step S6. The light-transmissive part 3 is held by the holding structures each of which is constructed of two or more of the number of holders 5 in corresponding one or in the lens-fastening lands 13 so that the light-transmissive part 3 is arranged at its predetermined position on the printed board 1 as shown in FIG. 14F.

Step S7

The adhesive 30, which fastens the lens, is finally cured in Step S7. The light-transmissive part 3 is fastened onto the printed board 1 by curing the adhesive 30 while the light-transmissive part 3 is held at the predetermined position on the printed board 1 by the holding structures as shown in FIG. 14F.

As discussed above, an LED light source according to the present disclosure that includes a light-transmissive part that refracts LED light to diffuse or collect the light so as to direct the light outward in a predetermined light distribution pattern can be suitably used for a backlight of a liquid crystal display or television, a lighting fixture, an indicator, a car headlight, or the like. An LED light source manufacturing method according to the present disclosure can suitably manufacture the LED light source.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:

1. An LED light source comprising:
a board that has a first surface;
two or more holders that are arranged on or above the first surface;
an LED that is arranged on or above the first surface;
a fastener that fastens the LED to the first surface;
a light-transmissive part that has an exterior shape larger than the LED as viewed in a plan view, and is arranged on or above an upper surface of the LED to refract light emitted by the LED so as to direct the light outward;
a supporter that is arranged on an exterior with respect to the LED as viewed in the plan view on a surface of the light-transmissive part facing the first surface of the board, the supporter being held by the two or more holders for positioning of the light-transmissive part at a predetermined position on the first surface of the board; and
an adhesive that bonds the supporter and the board together,
wherein each of the holders includes a protrusion that is formed on the first surface of the board, and
wherein the two or more holders, which hold the supporter, as the protrusions are arranged at vertices of a polygon, and the supporter is arranged in an area defined by the polygon.

2. The LED light source according to claim 1,
further comprising a plurality of the supporters that are arranged on the exterior with respect to the LED as viewed in the plan view at different positions on the surface of the light-transmissive part facing the first surface of the board,
wherein each supporter of the plurality of the supporters is held by two or more holders for positioning of the light-transmissive part at the predetermined position on the first surface of the board.

3. The LED light source according to claim 1, wherein the polygon has not smaller than three to not greater than six vertices.

4. The LED light source according to claim 1, wherein each protrusion has an inclined surface that declines toward the supporter as viewed in a cross-sectional side view to guide the supporter.

5. The LED light source according to claim 1, wherein each protrusion has a semicircular or semielliptical shape as viewed in a cross-sectional side view.

6. The LED light source according to claim 1, wherein the board is a printed board, and the two or more holders are formed of a material identical to a material of the fastener.

7. The LED light source according to claim 6,
wherein the fastener and the two or more holders are formed of solder, and
wherein the board includes
an electrode-connection electrically conducting layer part that receives the fastener on or above the first surface, and
a holder-placement electrically conducting layer part that receives the holder on or above the first surface.

8. The LED light source according to claim 1, wherein the supporter has a pillar shape.

9. The LED light source according to claim 1, wherein the supporter is tapered.

10. The LED light source according to claim 1,
wherein the supporter has a receptacle recessed part in an end surface of the supporter, and
wherein at least one holder of the two or more holders includes a holding protrusion part that guides the receptacle recessed part so that the supporter is held by the at least one holder by guiding the receptacle recessed part by the holding protrusion part.

11. The LED light source according to claim 1, wherein the LED light source is used as a light source for a liquid crystal display backlight.

12. The LED light source according to claim 1, wherein the light-transmissive part is as an optical lens.

13. The LED light source according to claim 1,
further comprising a plurality of the supporters that are arranged on the exterior with respect to the LED as viewed in the plan view at different positions on the surface of the light-transmissive part facing the first surface of the board,
wherein each supporter of the plurality of the supporters is held by three or more holders for positioning of the light-transmissive part at the predetermined position on the first surface of the board.

14. An LED light source comprising:
a board that has a first surface;
a holder that is arranged on or above the first surface;
an LED that is arranged on or above the first surface;
a fastener that fastens the LED to the first surface;
a light-transmissive part that has an exterior shape larger than the LED as viewed in a plan view, and is arranged on or above an upper surface of the LED to refract light emitted by the LED so as to direct the light outward;
a supporter that is arranged on an exterior with respect to the LED as viewed in the plan view on a surface of the light-transmissive part facing the first surface of the board, the supporter being held by the holder for positioning of the light-transmissive part at a position corresponding to an optical lens on the first surface of the board; and
an adhesive that bonds the supporter and the board together,
wherein the supporter has a receptacle recessed part in an end surface of the supporter,
wherein the holder includes a holding protrusion part that guides the receptacle recessed part so that the supporter is held by the holder by guiding the receptacle recessed part by the holding protrusion part,
wherein the supporter has a bottom end with a flat end surface, and
wherein the flat end surface of the supporter is directly bonded to the first surface of the board with a planar adhesive layer.

15. The LED light source according to claim 14,
further comprising two or more additional holders that each includes a protrusion that is formed on the first surface of the board, and
wherein the protrusions of the two or more additional holders are arranged at vertices of a polygon, and the supporter is arranged in an area defined by the polygon.

16. The LED light source according to claim 14, further comprising:
a plurality of the supporters that are arranged on the exterior with respect to the LED as viewed in the plan view at different positions on the surface of the light-transmissive part facing the first surface of the board, and a plurality of the holders that are arranged on or above the first surface,
wherein each supporter of the plurality of the supporters has the receptacle recessed part in the end surface of the supporter, and
wherein each holder of the plurality of holders includes the holding protrusion part that guides the receptacle recessed part so that the corresponding supporter is held by the corresponding holder by guiding the receptacle recessed part by the holding protrusion part.

17. A method of manufacturing an LED light source comprising:
preparing
an LED;
a board that has a first surface;
a light-transmissive part that has an exterior shape larger than the LED as viewed in a plan view, refracts light emitted by the LED so as to direct the light outward, and includes a supporter arranged on an exterior with respect to the LED as viewed in the plan view on a surface of the light-transmissive part facing the first surface, the supporter has a bottom end with a flat end surface;
a fastener material that forms a fastener to fasten the LED to the board and a holder to hold the light-transmissive part; and
an adhesive that directly bonds the flat end surface of the supporter and the board together;
simultaneously forming the fastener and the holder on or above the first surface from the fastener material;
fastening the LED to the first surface by using the fastener placed between the LED and the first surface; and
arranging the light-transmissive part at a predetermined position on the first surface and bonding the flat end surface of the supporter and the board together by using the adhesive such that an optical axis of the light-transmissive part agrees with an optical axis of the LED.

18. The method of manufacturing an LED light source according to claim 17, wherein the forming of the fastener and the holder is performed in a reflow process.

19. The method of manufacturing an LED light source according to claim 18, further comprising forming an electrode-connection electrically conducting layer part that receives the fastener and a holder-placement electrically conducting layer part that receives the holder on or above the first surface.

20. The method of manufacturing an LED light source according to claim 17, wherein in the forming the holder on or above the first surface from the fastener material, a number of protrusions are formed as the holder at positions to surround the supporter and each protrusion has a convex upper surface.

* * * * *